(12) United States Patent
Verma et al.

(10) Patent No.: US 11,476,192 B2
(45) Date of Patent: *Oct. 18, 2022

(54) TRANSISTOR STRUCTURE IN LOW NOISE AMPLIFIER

(71) Applicant: UNITED MICROELECTRONICS CORP., Hsin-Chu (TW)

(72) Inventors: Purakh Raj Verma, Singapore (SG); Chia-Huei Lin, Hsinchu (TW); Kuo-Yuh Yang, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/734,373

(22) Filed: Jan. 5, 2020

(65) Prior Publication Data

US 2020/0144184 A1 May 7, 2020

Related U.S. Application Data

(63) Continuation of application No. 15/893,676, filed on Feb. 11, 2018, now Pat. No. 10,600,734.

(30) Foreign Application Priority Data

Jan. 15, 2018 (CN) .......................... 201810035168.4

(51) Int. Cl.
*H01L 23/528* (2006.01)
*H01L 29/08* (2006.01)
(Continued)

(52) U.S. Cl.
CPC ...... *H01L 23/5283* (2013.01); *H01L 27/1203* (2013.01); *H01L 27/124* (2013.01); *H01L 29/0847* (2013.01); *H01L 29/4232* (2013.01); *H01L 29/7835* (2013.01); *H01L 21/3212* (2013.01); *H01L 21/7684* (2013.01); *H01L 21/76802* (2013.01); *H01L 21/76843* (2013.01);
(Continued)

(58) Field of Classification Search
None
See application file for complete search history.

(56) References Cited

U.S. PATENT DOCUMENTS 5,355,008 A * 10/1994 Moyer ................ H01L 29/7816
257/341
5,652,441 A 7/1997 Hashimoto
(Continued)

FOREIGN PATENT DOCUMENTS

CN 101635506 A 1/2010
CN 107393924 A 11/2017

*Primary Examiner* — Nilufa Rahim
(74) *Attorney, Agent, or Firm* — Winston Hsu

(57) ABSTRACT

A semiconductor device includes: a first gate line and a second gate line extending only along a first direction, a third gate line and a fourth gate line extending along the first direction and between the first gate line and the second gate line, a fifth gate line and a sixth gate line extending along a second direction between the first gate line and the second gate line and intersecting the third gate line and the fourth gate line, and first contact plugs on the first gate line. Preferably, the first direction is perpendicular to the second direction and the first gate line and the second gate line are directly connected to the fifth gate line and the sixth gate line.

10 Claims, 2 Drawing Sheets

(51) Int. Cl.
  *H01L 29/78* (2006.01)
  *H01L 27/12* (2006.01)
  *H01L 29/423* (2006.01)
  H01L 29/45 (2006.01)
  H01L 21/768 (2006.01)
  H03F 3/16 (2006.01)
  H01L 21/321 (2006.01)
  H01L 21/84 (2006.01)

(52) U.S. Cl.
  CPC ........ *H01L 21/76895* (2013.01); *H01L 21/84* (2013.01); *H01L 29/45* (2013.01); *H03F 3/16* (2013.01); *H03F 2200/294* (2013.01)

(56) References Cited

U.S. PATENT DOCUMENTS

| | | | |
|---|---|---|---|
| 6,387,739 | B1 | 5/2002 | Smith, III |
| 9,559,644 | B2 | 1/2017 | Maxim et al. |
| 2009/0278207 | A1* | 11/2009 | Greenberg .......... H01L 27/0207 257/386 |
| 2010/0019835 | A1 | 1/2010 | Arisaka |
| 2013/0037888 | A1 | 2/2013 | Han |
| 2013/0168774 | A1 | 7/2013 | Jeon |
| 2016/0260727 | A1 | 9/2016 | Tsao |
| 2017/0040330 | A1 | 2/2017 | Hsu |
| 2017/0126221 | A1* | 5/2017 | Hayashi .................. H03B 5/02 |
| 2017/0236823 | A1* | 8/2017 | Lee ........................ H03K 19/20 257/369 |

* cited by examiner

TRANSISTOR STRUCTURE IN LOW NOISE AMPLIFIER

CROSS REFERENCE TO RELATED APPLICATIONS

This is a continuation application of U.S. patent application Ser. No. 15/893,676, filed on Feb. 11, 2018, and all benefits of such earlier application are hereby claimed for this new continuation application.

BACKGROUND OF THE INVENTION

1. Field of the Invention

The invention relates to a semiconductor device, and more particularly to a transistor structure applied in a low noise amplifier.

2. Description of the Prior Art

As technology evolves, wireless communication is an important part of human life. Various electronic devices, such as smart phones, smart wearable devices, tablets, etc., utilize wireless radio frequency (RF) systems to transmit and receive wireless signals. A low noise amplifier (LNA) and a power amplifier (PA) are necessary amplifying circuits in the wireless RF system. In order to achieve better performance (e.g., linearity), the amplifying circuit requires an appropriate bias point. A common way is to electrically connect a biasing module to the amplifying circuit, so as to utilize the biasing module for providing a bias point for the amplifying circuit.

Nevertheless, the design and performance of transistors in device such as low noise amplifier has found to be insufficient parameters such as gate resistance, gate to body capacitance, and min noise figure. Since these parameters play a significant role in low noise amplifiers today, how to provide a better architecture for the transistors for improving the performance of the device has become an important task in this field.

SUMMARY OF THE INVENTION

According to an embodiment of the present invention, a semiconductor device includes: a first gate line and a second gate line extending along a first direction; a third gate line and a fourth gate line extending along the first direction and between the first gate line and the second gate line; and a fifth gate line and a sixth gate line extending along a second direction between the first gate line and the second gate line and intersecting the third gate line and the fourth gate line.

According to another aspect of the present invention, a semiconductor device includes: a first gate line and a second gate line extending along a first direction, a third gate extending along a second direction and between the first gate line and the second gate line, and a drain region adjacent to one side of the third gate line. Preferably, the third gate line includes a first protrusion overlapping the drain region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
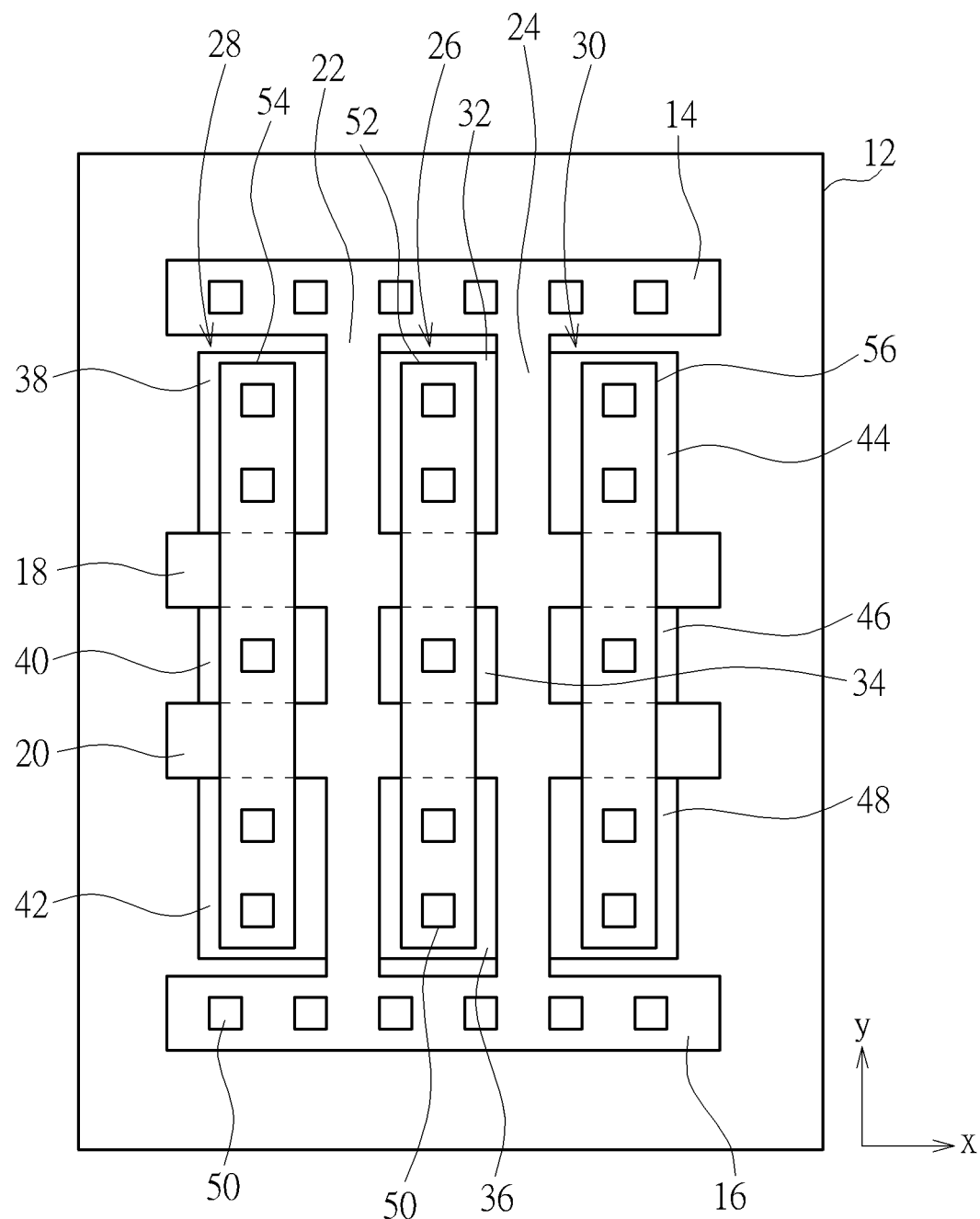
FIG. 1 illustrates a top view of a semiconductor device applied in low noise amplifier according to an embodiment of the present invention.

Referring to FIG. 1, FIG. 1 illustrates a top view of a semiconductor device applied in low noise amplifier according to an embodiment of the present invention. As shown in FIG. 1, the semiconductor device preferably includes a first gate line 14, a second gate line 16, a third gate line 18, a fourth gate line 20, a fifth gate line 22, and a sixth gate line 24 disposed on a substrate 12. Preferably, the substrate 12 is a silicon-on-insulator (SOI) substrate including a first semiconductor layer, an insulating layer disposed on the first semiconductor layer, and a second semiconductor layer disposed on the insulating layer, in which the first semiconductor layer and the second semiconductor layer could include semiconductor material including but not limited to for example silicon, germanium or silicon germanium (SiGe) and the insulating layer could include dielectric material such as silicon oxide.

Viewing from a more detailed perspective, the first gate line 14 and the second gate line 16 are extending along a first direction (such as X-direction), the third gate line 18 and the fourth gate line 20 are also extending along the same first direction and the between the first gate line 14 and the second gate line 16, and the fifth gate line 22 and the sixth gate line 24 are extending along a second direction (such as Y-direction), in which the fifth gate line 22 and the sixth gate line 24 are extending between the first gate line 14 and the second gate line 16 while intersecting the third gate line 18 and the fourth gate line 20.

The semiconductor device also includes a source region 26 disposed between the fifth gate line 22 and the sixth gate line 24, a first drain region 28 disposed on one side of the fifth gate line 22, and a second drain region 30 disposed on one side of the sixth gate line 24. Specifically, the source region 26 is extending along the second direction and further including doped regions 32, 34, 36, in which the doped region 32 is between the first gate line 14 and the third gate line 18, the doped region 34 is between the third gate line 18 and the fourth gate line 20, and the doped region 36 is between the second gate line 16 and the fourth gate line 20. Similar to the source region 26, the first drain region 28 is extending along the second direction and further including doped regions 38, 40, 42, in which the doped region 38 is between the first gate line 14 and the third gate line 18, the doped region 40 is between the third gate line 18 and the fourth gate line 20, and the doped region 42 is between the second gate line 16 and the fourth gate line 20. The second drain region 30 is extending along the second direction and further including doped regions 44, 46, 48, in which the doped region 44 is between the first gate line 14 and the third gate line 18, the doped region 46 is between the third gate line 18 and the fourth gate line 20, and the doped region 48 is between the second gate line 16 and the fourth gate line 20.

In this embodiment, the doped regions 32, 38, 44 between the first gate line 14 and the third gate line 18 and the doped regions 36, 42, 48 between the second gate line 16 and the fourth gate line 20 preferably include same conductive type such as a first conductive. The doped regions 42, 40, 46 between the third gate line 18 and the fourth gate line 20 on the other hand include a second conductive type, in which the first conductive type in this embodiment is n-type and the second conductive type is p-type. Nevertheless, according to other embodiment of the present invention, the first conductive type could also be p-type while the second conductive type could be n-type, which is also within the scope of the present invention.

Preferably, the aforementioned gate lines or gate structures including the first gate line 14, the second gate line 16, the third gate line 18, the fourth gate line 20, the fifth gate line 22, and the sixth gate line 24 could all be fabricated through a gate first process, a high-k first process from a gate last process, or a high-k last process from the gate last process to form a monolithic structure altogether. In other words, the gate lines could be polysilicon gate lines made from polysilicon or could be metal gate lines transformed from polysilicon gate lines through replacement metal gate (RMG) process into metal gate lines, which are all within the scope of the present invention. Since the fabrication of polysilicon gate lines and metal gate lines are well known to those skilled in the art, the details of which are not explained herein for the sake of brevity.

The semiconductor device also includes a plurality of contact plugs 50 disposed on the first gate line 14, the second gate line 16, the source region 26, the first drain region 28, and the second drain region 30. The formation of the contact plugs 50 could be accomplished by first forming an inter-layer dielectric (ILD) layer (not shown) on the substrate 12, and then conductive a pattern transfer process by using a patterned mask to remove part of the ILD layer adjacent to each of the gate lines to form a plurality of contact holes exposing the first gate line 14, the second gate line 16, the source region 26, the first drain region 28, and the second drain region 30 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as chemical mechanical polishing (CMP) process is conducted to remove part of aforementioned barrier layer and low resistance metal layer for forming contact plugs 50 electrically connecting the first gate line 14, the second gate line 16, the source region 26, the first drain region 28, and the second drain region 30.

Next, metal interconnective process could be conducted thereafter to form inter-metal dielectric (IMD) layer and metal interconnections electrically connecting each of the contact plugs 50. In this embodiment, the semiconductor device includes a first metal interconnection 52 extending along the second direction between the fifth gate line 22 and the sixth gate line 24 and electrically connected to the source region 26, a second metal interconnection 54 extending along the second direction on one side of the fifth gate line 22 and electrically connected to the first drain region 28, and a third metal interconnection 56 extending along the second direction on one side of the sixth gate line 24 and electrically connected to the second drain region 30, in which the first metal interconnection 52, the second metal interconnection 54, and the third metal interconnection 56 intersect the third gate line 18 and the fourth gate line 20.

Figure 2:
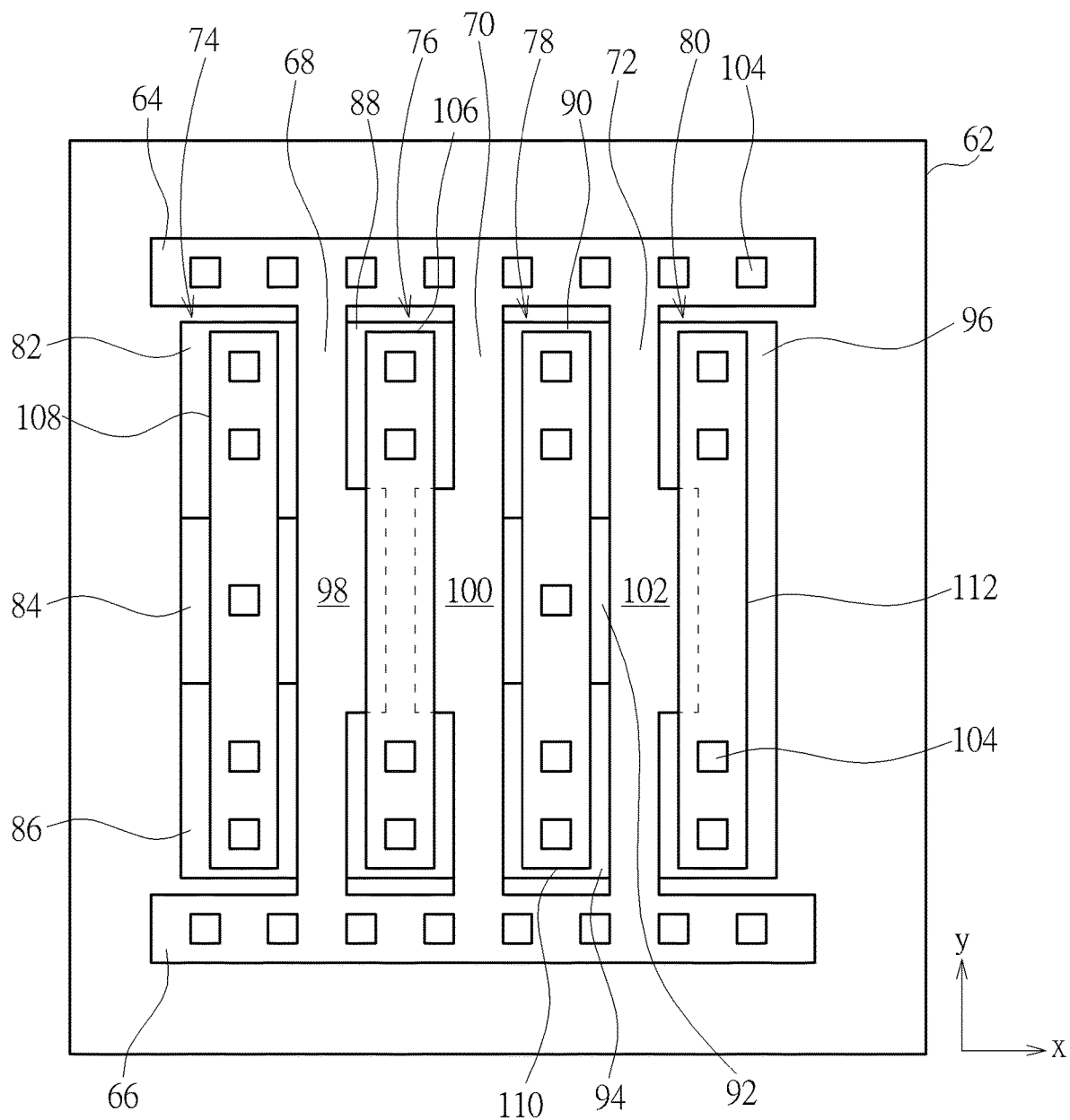
FIG. 2 illustrates a top view of a semiconductor device applied in low noise amplifier according to an embodiment of the present invention.

Referring to FIG. 2, FIG. 2 illustrates a top view of a semiconductor device applied in low noise amplifier according to an embodiment of the present invention. As shown in FIG. 2, the semiconductor device preferably includes a first gate line 64, a second gate line 66, a third gate line 68, a fourth gate line 70, and a fifth gate line 72 disposed on a substrate 62. Preferably, the substrate 62 is a silicon-on-insulator (SOI) substrate including a first semiconductor layer, an insulating layer disposed on the first semiconductor layer, and a second semiconductor layer disposed on the insulating layer, in which the first semiconductor layer and the second semiconductor layer could include semiconductor material including but not limited to for example silicon, germanium or silicon germanium (SiGe) and the insulating layer could include dielectric material such as silicon oxide.

In this embodiment, the first gate line 64 and the second gate line 66 are extending along a first direction (such as X-direction) and the third gate line 68, the fourth gate line 70, and the fifth gate line 72 are extending along a second direction (such as Y-direction). The semiconductor device also includes a source region 74 disposed on one side of the third gate line 68, a first drain region 76 disposed between the third gate line 68 and the fourth gate line 70, a second source region 78 disposed between the fourth gate line 70 and the fifth gate line 72, and a second drain region 80 disposed on one side of the fifth gate line 72. Specifically, the first source region 74 is extending along the second direction and further including doped regions 82, 84, 86, the first drain region 76 is extending along the second direction and further including a doped region 88, the second source region 78 is extending along the second direction and further including doped regions 90, 92, 94, and the second drain region 80 is extending along the second direction and further including a doped region 96.

It should be noted that the third gate line 68 preferably includes a protrusion 98 overlapping or covering part of the first drain region 76, the fourth gate line 70 includes a protrusion 100 overlapping part of the first drain region 76, and the fifth gate line 72 includes a protrusion 102 overlapping part of the second drain region 80. Specifically, the protrusions 98, 100 of the third gate line 68 and the fourth gate line 70 are symmetrical and the symmetrical protrusions on the third gate line 68 and the fourth gate line 70 could be copied repeatedly to the gate lines on the two sides. For instance, even though only one protrusion 102 is shown on the fifth gate line 72 on the right side of the fourth gate line 70, it would also be desirable to provide an additional sixth gate line (not shown) on the right side of fifth gate line 72 having identical protrusion design as the protrusion 100 on the fourth gate line 70 so that both the protrusion 102 of the fifth gate line 72 and the protrusion of the sixth gate line would overlap part of the second drain region 80 at the same time.

In this embodiment, the doped regions 82, 86 of the first source region 74, the doped region 88 of the first drain region 76, the doped regions 90, 94 of the second source region 78, and the doped region 96 of the second drain region 80 preferably include same conductive type or first conductive type while the doped region 84 of the first source region 74 and the doped region 92 of the second source region 78 include second conductive type, in which the first conductive type is n-type and the second conductive type is p-type. Nevertheless, according to other embodiment of the present invention, the first conductive type could also be p-type while the second conductive type could be n-type, which is also within the scope of the present invention.

Similar to the aforementioned embodiment, each of the gate lines or gate structures in this embodiment including the first gate line 64, the second gate line 66, the third gate line 68, the fourth gate line 70, and the fifth gate line 72 could all be fabricated through a gate first process, a high-k first process from a gate last process, or a high-k last process from the gate last process. In other words, the gate lines could be polysilicon gate lines made from polysilicon or could be metal gate lines transformed from polysilicon gate lines through replacement metal gate (RMG) process into metal gate lines, which are all within the scope of the present invention. Since the fabrication of polysilicon gate lines and metal gate lines are well known to those skilled in the art, the details of which are not explained herein for the sake of brevity.

The semiconductor device also includes a plurality of contact plugs 104 disposed on the first gate line 64, the second gate line 66, the first source region 74, the first drain region 76, the second source region 78, and the second drain region 80. The formation of the contact plugs 104 could be accomplished by first forming an interlayer dielectric (ILD) layer (not shown) on the substrate 62, and then conductive a pattern transfer process by using a patterned mask to remove part of the ILD layer adjacent to each of the gate lines to form a plurality of contact holes exposing the first gate line 64, the second gate line 66, the first source region 74, the first drain region 76, the second source region 78, and the second drain region 80 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as chemical mechanical polishing (CMP) process is conducted to remove part of aforementioned barrier layer and low resistance metal layer for forming contact plugs 104 electrically connecting the first gate line 64, the second gate line 66, the first source region 74, the first drain region 76, the second source region 78, and the second drain region 80.

Next, metal interconnective process could be conducted thereafter to form inter-metal dielectric (IMD) layer and metal interconnections electrically connecting each of the contact plugs 104. In this embodiment, the semiconductor device includes a first metal interconnection 106 extending along the second direction between the third gate line 68 and the fourth gate line 70 and electrically connected to the first drain region 76, a second metal interconnection 108 extending along the second direction on one side of the third gate line 68 and electrically connected to the first source region 74, a third metal interconnection 110 extending along the second direction between the fourth gate line 70 and the fifth gate line 72 and electrically connected to the second source region 78, and a fourth metal interconnection 112 extending along the second direction on one side of the fifth gate line 72 and electrically connected to the second drain region 80.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first gate line and a second gate line extending only along a first direction;
   a third gate line and a fourth gate line extending along the first direction and between the first gate line and the second gate line;
   a fifth gate line and a sixth gate line extending along a second direction between the first gate line and the second gate line and intersecting the third gate line and the fourth gate line, wherein the first direction is perpendicular to the second direction, the first gate line and the second gate line are directly connected to the fifth gate line and the sixth gate line, and a distance between edges of the first gate line and the third gate line is equal to a distance between edges of the second gate line and the fourth gate line and greater than a distance between edges of the third gate line and the fourth gate line while the first gate line is immediately adjacent to the third gate line and the second gate line is immediately adjacent to the fourth gate line;
   first contact plugs on the first gate line and the second gate line and no contact plugs on the third gate line, the fourth gate line, the fifth gate line, and the sixth gate line; and
   a first metal interconnection extending along the second direction between the fifth gate line and the sixth gate line and overlapping the third gate line and the fourth gate line, wherein the first metal interconnection orthogonal to the first gate line having the first contact plugs comprises a first side extending along the first direction and a second side extending along the second direction and the second side is greater than three times the first side.

2. The semiconductor device of claim 1, further comprising:
   a source region between the fifth gate line and the sixth gate line;
   a first drain region on one side of the fifth gate line; and
   a second drain region on one side of the sixth gate line.

3. The semiconductor device of claim 2, further comprising a contact plug formed on each of the source region, the first drain region, and the second drain region between the third gate line and the fourth gate line.

4. The semiconductor device of claim 2, further comprising:
   a second metal interconnection extending along the second direction on the one side of the fifth gate line and electrically connected to the first drain region; and
   a third metal interconnection extending along the second direction on the one side of the sixth gate line and electrically connected to the second drain region.

5. The semiconductor device of claim 4, wherein the first metal interconnection, the second metal interconnection, and the third metal interconnection intersect the third gate line and the fourth gate line.

6. The semiconductor device of claim 1, further comprising a first doped region between the first gate line and the third gate line.

7. The semiconductor device of claim 6, further comprising a second doped region between the second gate line and the fourth gate line.

8. The semiconductor device of claim 7, wherein the first doped region and the second doped region comprise same conductive type.

9. The semiconductor device of claim 7, further comprising a third doped region between the third gate line and the fourth gate line.

10. The semiconductor device of claim 9, wherein the first doped region and the third doped region comprise different conductive type.

* * * * *